(12) United States Patent
Azar

(10) Patent No.: US 6,510,053 B1
(45) Date of Patent: Jan. 21, 2003

(54) CIRCUIT BOARD COOLING SYSTEM

(75) Inventor: Kaveh Azar, Westwood, MA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/663,736

(22) Filed: Sep. 15, 2000

(51) Int. Cl.[7] .............................................. H05K 7/20
(52) U.S. Cl. ..................... 361/704; 361/692; 361/698; 361/735; 257/719; 174/16.3
(58) Field of Search ................ 361/698, 689, 361/692, 415, 700–710, 717–723, 735, 796; 174/15.2, 16.3; 257/706–727; 165/46, 80.2, 80.3, 80.4, 185, 104.14, 104.19, 104.21, 104.33, 104.26; 426/614, 901; 211/41; 24/524–526

(56) References Cited

U.S. PATENT DOCUMENTS

| | | | | |
|---|---|---|---|---|
| 3,268,772 A | * | 8/1966 | Kamei et al. ................ 317/100 |
| 3,956,673 A | * | 5/1976 | Seid ............................. 317/100 |
| 4,366,526 A | * | 12/1982 | Lijoi et al. ................... 361/385 |
| 4,468,717 A | * | 8/1984 | Mathias et al. .............. 361/382 |
| 4,498,119 A | * | 2/1985 | Cronin ........................ 361/386 |
| 4,589,057 A | * | 5/1986 | Short ........................... 361/386 |
| 4,628,407 A | * | 12/1986 | August et al. ............... 361/388 |
| 4,777,561 A | * | 10/1988 | Murthy et al. ............... 361/385 |
| 4,811,165 A | * | 3/1989 | Currier et al. ............... 361/386 |
| 4,867,235 A | * | 9/1989 | Grapes et al. ............... 165/185 |
| 4,916,575 A | * | 4/1990 | Asten .......................... 361/386 |
| 4,963,414 A | * | 10/1990 | Vasseur ....................... 428/195 |
| 5,088,005 A | * | 2/1992 | Ciaccio ....................... 361/385 |
| 5,195,021 A | * | 3/1993 | Ozmat et al. ................ 361/386 |
| 5,331,510 A | * | 7/1994 | Ouchi et al. ................. 361/702 |
| 5,424,916 A | * | 6/1995 | Martin ........................ 361/698 |
| 5,482,109 A | * | 1/1996 | Kunkel ....................... 165/80.3 |
| 5,565,705 A | * | 10/1996 | Romero et al. ............. 257/718 |
| 5,949,650 A | * | 9/1999 | Bulante et al. ............. 361/704 |
| 6,055,157 A | * | 4/2000 | Bartilson ..................... 361/699 |
| 6,062,299 A | * | 5/2000 | Choo et al. .................... 165/46 |

\* cited by examiner

Primary Examiner—Darren Schuberg
Assistant Examiner—Michael Datskovsky

(57) ABSTRACT

A circuit board cooling system includes a thermally conductive element sandwiched between two circuit boards. The thermally conductive element of this thermal sandwich conducts heat away from both of the attached circuit cards. The thermally conductive element may be a solid slab of thermally conductive material, such as copper, it may be a hollow, substantially planar thermal conductor with an internally circulating cooling fluid, or it may be a substantially planar heat pipe, for example.

21 Claims, 9 Drawing Sheets

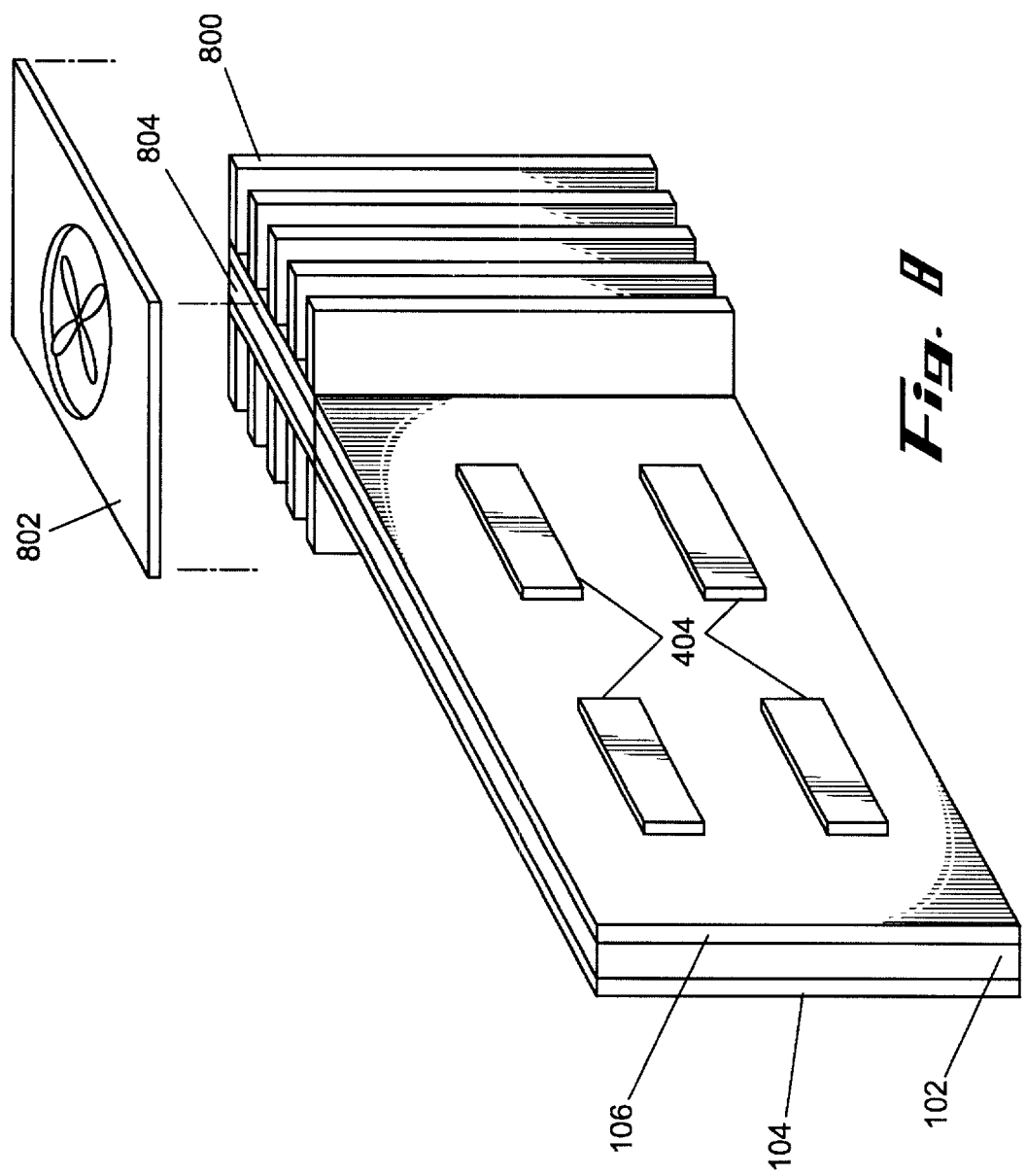

CIRCUIT BOARD COOLING SYSTEM

FIELD OF THE INVENTION

The invention relates to the cooling of electronic components and, in particular, to the cooling of electronic components mounted on a circuit board.

BACKGROUND OF THE INVENTION

The speed of electronic components steadily accelerates and, at the same time, increase in density. Additionally, more components are often placed within a single housing than ever before. All these factors; increased speed of operation, increased density of circuitry within a component, and the increased density of components within a housing, contribute to higher operating temperatures. As the temperature of electronic components increase, their reliability decreases. Heat equals failure and it must be dissipated in order to ensure the proper operation of systems that employ components. Various approaches to the cooling of electronic components have been pursued. Forced fluid cooling is described, for example in, U.S. Pat. No. 4,851,965 issued to Garbuzda et al (Garbuzda), which is hereby incorporated by reference. Garbuzda describes the use of jet impingement of air onto the heat generating component through separate plenums. A circuit pack with inboard jet cooling is described in U.S. Pat. No. 5,067,047 issued to Azar, which is hereby incorporated by reference. It has also been suggested that air can be blown onto the components through holes in the enclosures or shields surrounding the circuit components (see for example, U.S. Pat. No. 4,393,437 issued to Bell et al and U.S. Pat No. 4,408,255 issued to Adkins, both of which are hereby incorporated by reference. It has been suggested that holes in the circuit boards themselves could allow air to impinge on components in circuit packs which are stacked (see, for example, U.S. Pat. No. 4,399,484 issued to Mayer which is hereby incorporated by reference).

Although effective in some ways, each of these approaches has its own limitations. An electronic cooling system that provides efficient and substantial cooling potential for electronics systems would be highly desirable.

SUMMARY

A circuit board cooling system in accordance with the principles of the present invention includes a "filling" of thermally conductive material sandwiched between two circuit boards. The term "thermally conductive material" is used herein to include a variety of materials, such as copper, aluminum, copper alloys, and other materials known in the art. The thermally conductive element of this thermal sandwich conducts heat away from both of the attached circuit cards. The thermally conductive extent may be a solid slab of thermally conductive material, such as copper, it may be a hollow, substantially planar thermal conductor with an internally circulating cooling fluid, or it may be a substantially planar heat pipe, for example. The circuit boards attached to either side of the thermally conductive element may be attached with both board's wiring sides in direct contact with the thermally conductive element, with both board's component sides in direct contact with the thermally conductive element, or with one board's component side and another board's wiring side in contact with the thermally conductive element. On or more cavities may be fashioned in the thermally conductive element to accommodate electronic components. The cavities may completely pierce the thermally conductive element, or they may form a well, or depression, in a surface of the thermally conductive element. Although circuit boards are typically coated with a dielectric material, or potted, to prevent electrical shorts, in order to ensure that the thermally conductive element does not short any circuits on the circuit cards, additional dielectric material may be placed on the surfaces of the thermally conductive element that make contact with the circuit boards. A "thermal grease" may be employed to form a good thermally conductive interface between the thermally conductive element and at least one of the attached circuit boards.

BRIEF DESCRIPTION OF THE DRAWINGS

The above and further features, aspects, and advantages of the invention will be apparent to those skilled in the art from the following detailed description, taken together with the accompanying drawings in which:

FIG. 7 is a perspective view of a circuit board cooling system in accordance with the principles of the present invention;

and

FIG. 8 is a perspective view of a circuit board cooling system in accordance with the principles of the present invention in which a heat exchanger, thermoelectric cooler or a fluid mover, such as a fan, may be employed to further enhance the cooling operation of a sandwiched thermally conductive element.

DETAILED DESCRIPTION

Figure 1:
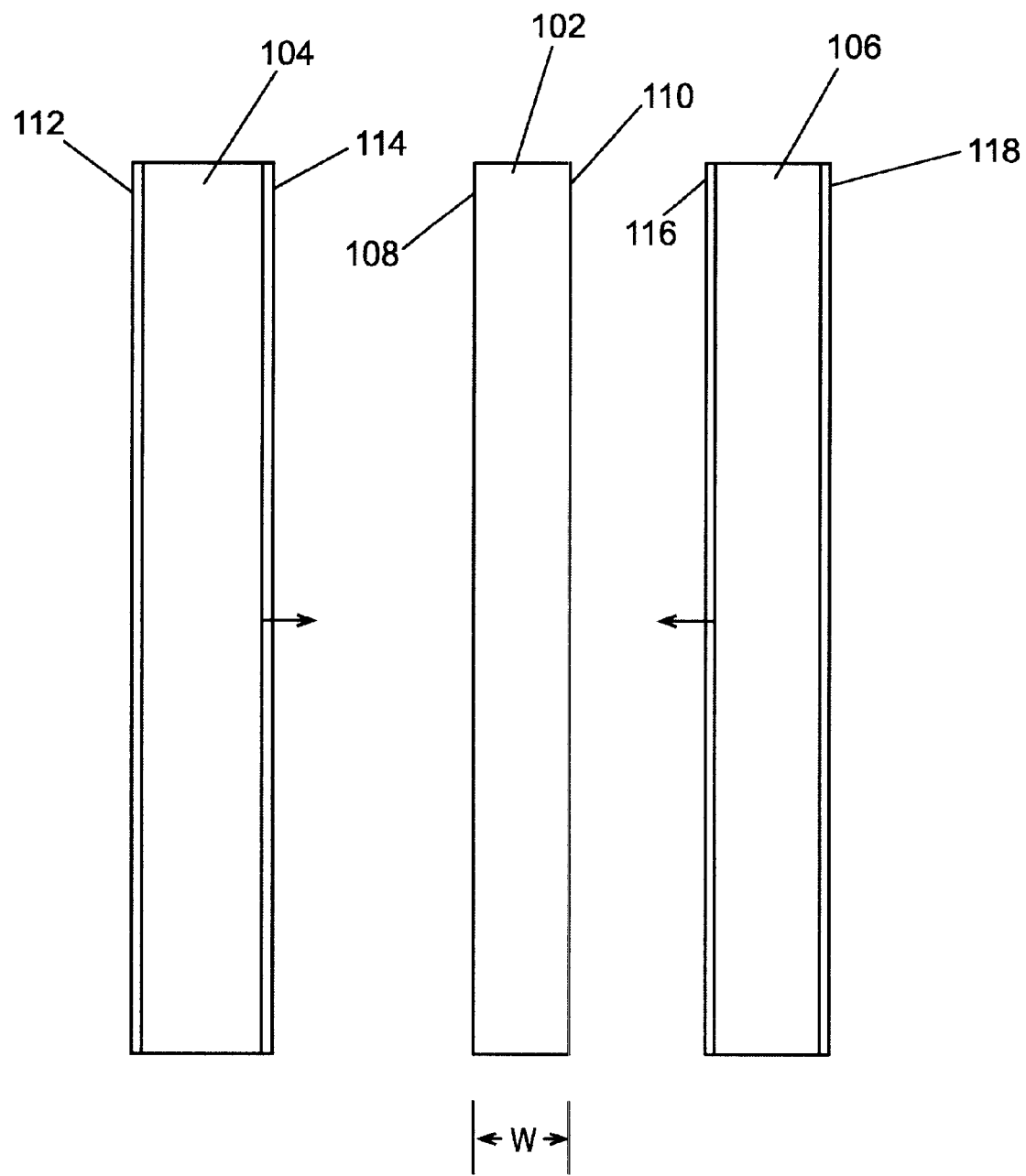
FIG. 1 is a front exploded view of a circuit board cooling system in accordance with the principles of the present invention.

The front exploded view of FIG. 1 of an illustrative embodiment of a circuit board cooling system 100 in accordance with the principles of the present invention includes a substantially planar thermally conductive element 102 and first 104 and second 106 circuit boards. As indicated by the arrows, the first 104 and second 106 circuit boards are attached, respectively, to the first 108 and second 110 sides of the cooling element 102. Attachment may be through various means, such as screws, adhesives, or spring clips, for example. The thermally conductive element 102 conducts heat away from the attached circuit board 104 and circuit board 106. The thermally conductive element 102 may be a solid stab of high thermally conductivity material, i.e., at least 40W/MK, such as copper, it may be a hollow, substantially planar thermal conductor with an internally circulating cooling fluid, or it may be a substantially planar heat pipe, for example. Heat pipes are known in the art and are discussed, for example, in U.S. Pat. No. 6,055,157 issued to Bartilson, and U.S. Pat. No. 4,921,041, issued to Akachi, which are hereby incorporated by reference.

In addition to the "potting", or dielectric coating (see 112, 114, 116, and 118), that is typically found on circuit boards, the thermally conductive element 102 may be coated on those sides 108 and that make thermal contact with the circuit boards 104 and 106, respectively, with a dielectric material, available from Chomerics, Inc. of Woburn, Mass. that, although a poor electrical conductor, is a good thermal conductor. The dielectric coating of the thermally conductive element 102 may be limited to those areas, such as those that mate with an integrated circuit "lead", where the conductive element 102 might inadvertently make electrical contact with a circuit on a circuit board.

A "thermal grease" or gap filler, also available from Chomerics, Inc., may be applied to sides 108 and 110 to enhance the thermal transfer between the thermally conductive element and attached first 104 and second 106 circuit boards. The width W of the thermally conductive element 102 may be such that, with the first 104 and second 106 boards attached, the edges of the boards fit within card guides in a card cage. The width W may relate to the inter-card spacing in a card rack in such a way as to permit first 104 and second 106 cards to slide into adjacent card slots, or into card slots separated by one or more intervening card slots.

Figure 2:
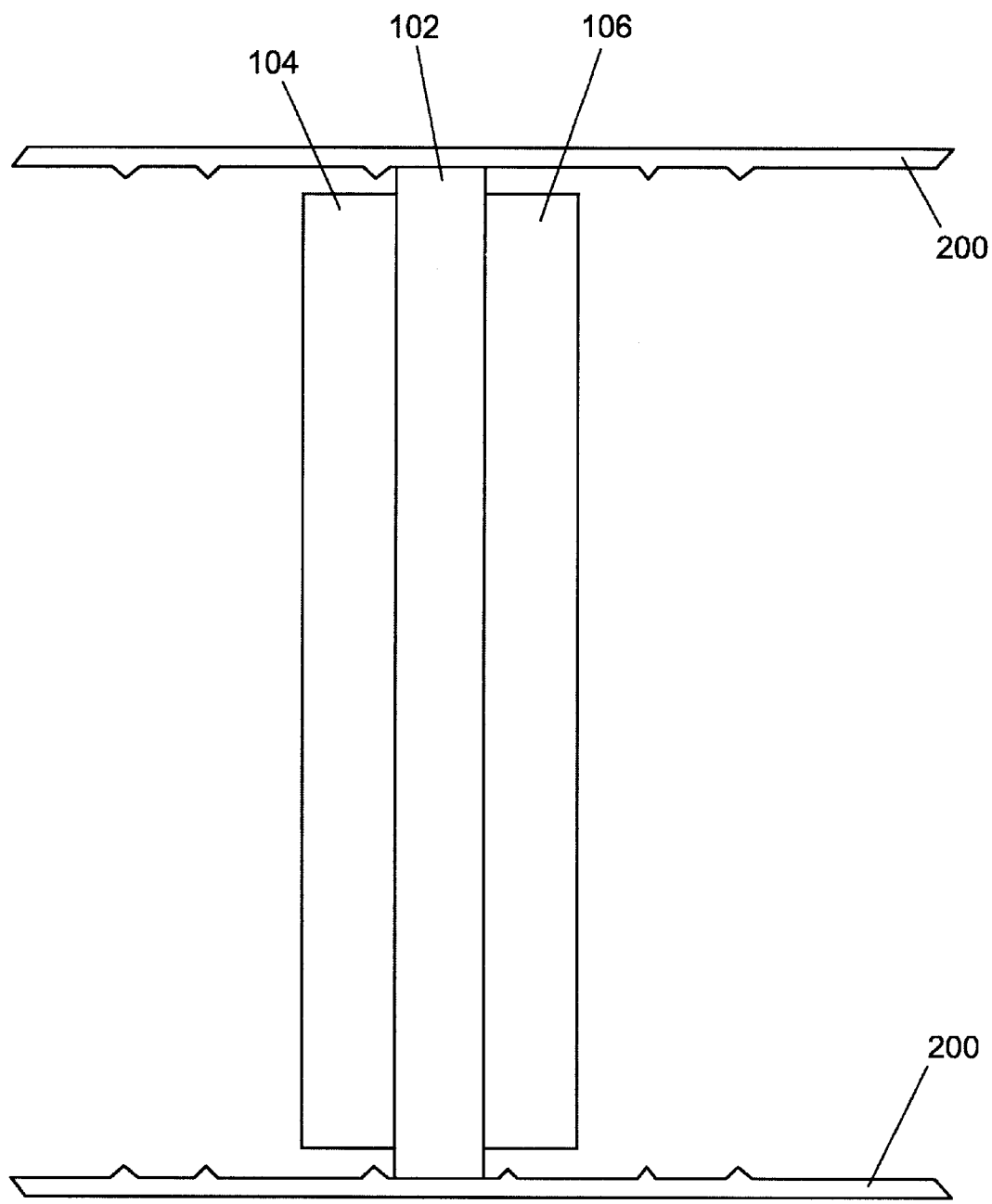
FIG. 2 is a front elevation view an embodiment of the invention in which the thermally conductive element extends vertically beyond attached circuit board.

The front elevation view of FIG. 2 illustrates an embodiment of the invention in which the thermally conductive element 102 extends vertically (this assumes the circuit boards are placed, as they typically are, in a vertical position within a card cage) beyond the attached circuit board 104 and circuit board 106. By extending beyond circuit board 104 and circuit board 106 in this manner, the conductive element may make direct contact with the card cage in which the circuit boards 104 and 106 are housed, thereby providing a path for thermal conduction away from the circuit boards 104 and 106 toward the card cage. The areas of contact between the thermally conductive element 102 and the card cage 200 may be coated with a thermally conductive grease to enhance thermal transfer. In this illustrative embodiment, the thermally conductive element 102 may also act as a card guide to guide circuit traces located at one end of each of the cards into contact with circuit traces on a backplane of the card cage, through edge connectors, for example.

Figure 3:
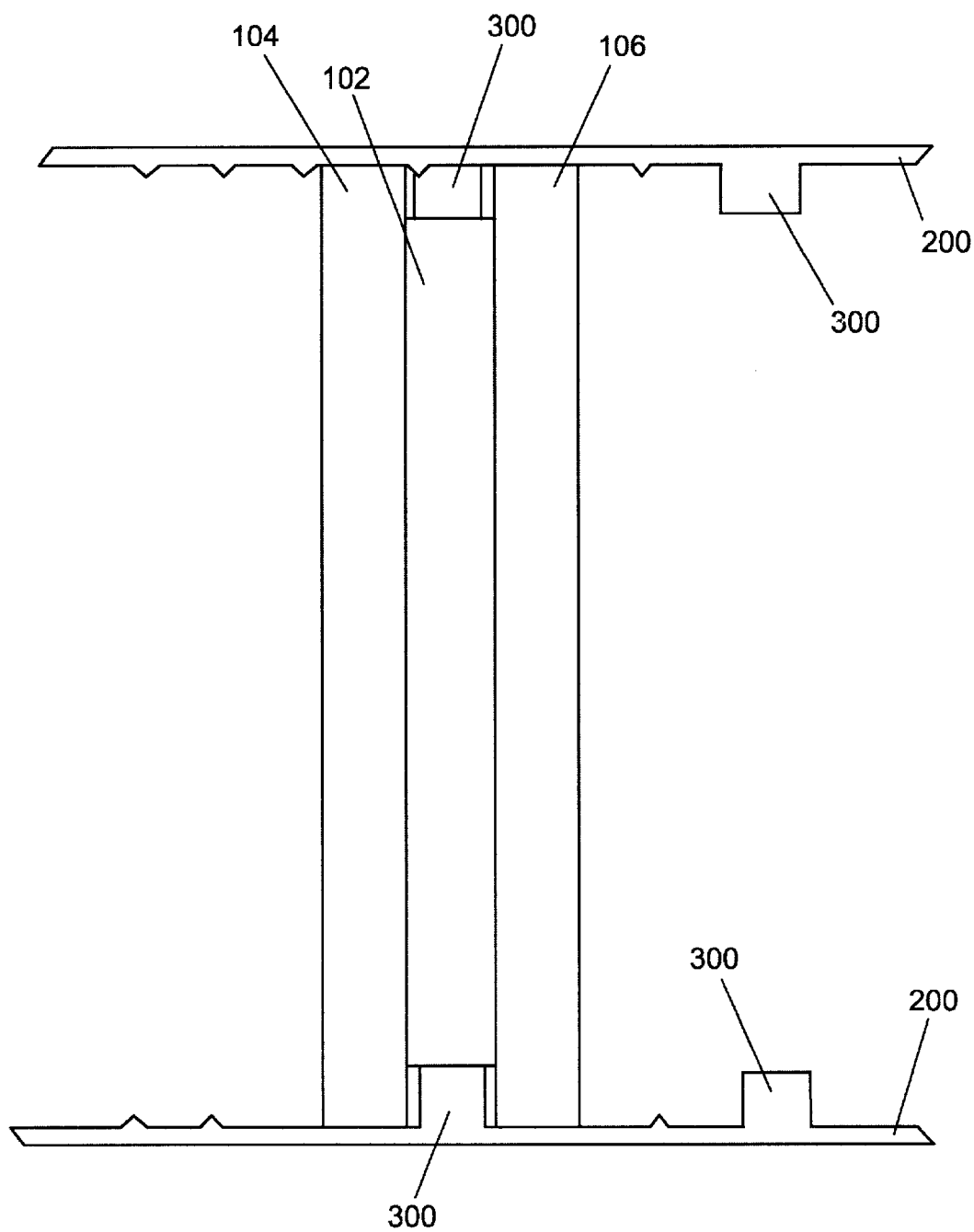
FIG. 3 is a front elevation view an embodiment of the invention in which the attached circuit board extend vertically beyond the thermally conductive element.

The front elevation view of FIG. 3 illustrates an embodiment of the invention in which the thermally conductive element does not extend vertically beyond the attached circuit board 104 and circuit board 106. In this embodiment, the conductive element may make direct contact with the card cage in which the circuit boards 104 and 106 are housed, thereby providing a path thermal conduction away from the circuit boards 104 and 106 toward the card cage, if the card cage includes elevated contact areas 300 situated between card slots. The areas of contact between the thermally conductive element 102 and the card cage 200 may be coated with a thermally conductive grease to enhance thermal transfer.

Figure 4A:
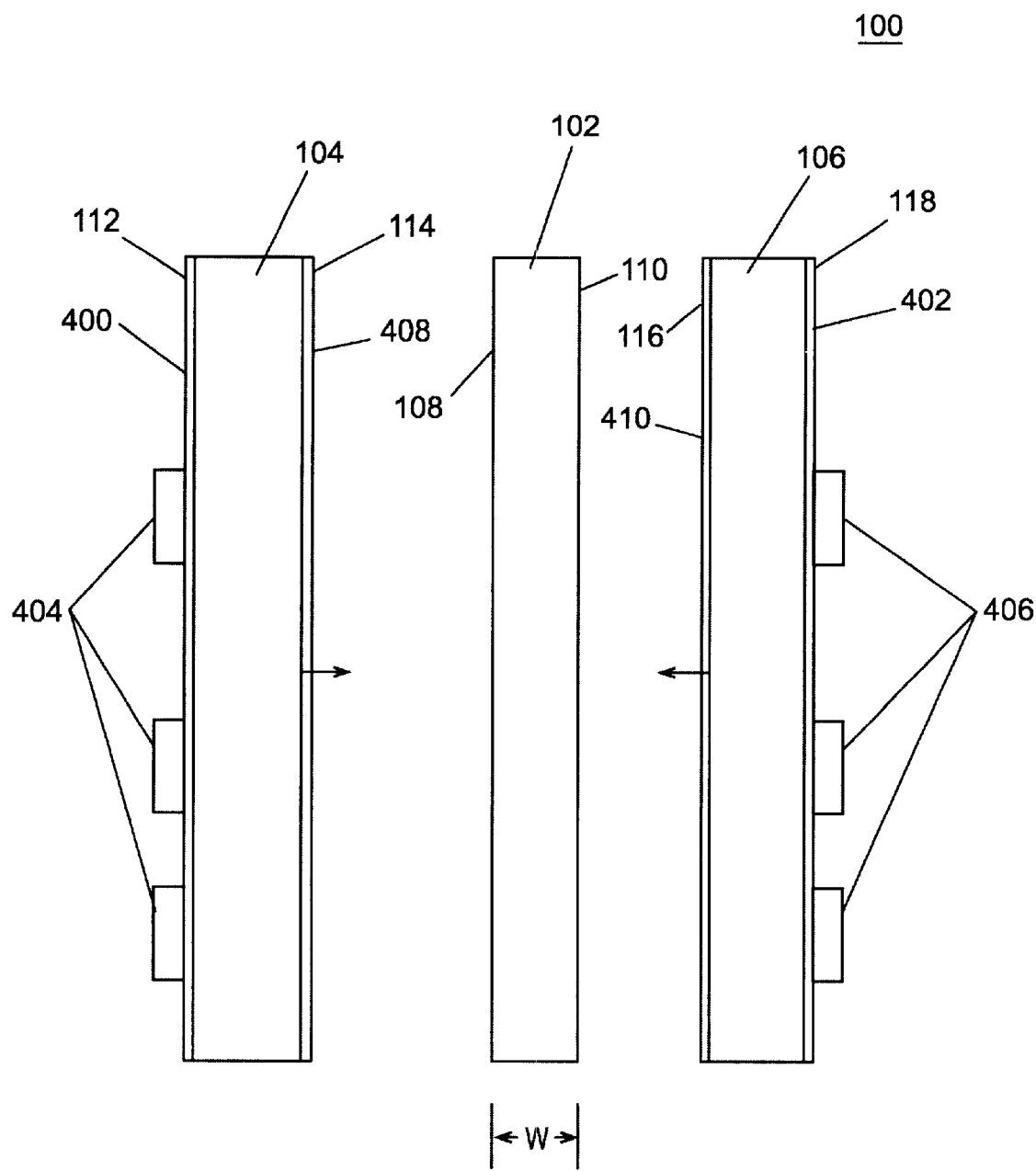
FIGS. 4A and 4B are, respectively, front elevation views of circuit board cooling systems in which circuit boards are attached to a thermally conductive element with circuit components facing away from and toward the thermally conductive element.

The front elevation view FIG. 4A illustrates an embodiment of the invention in which the thermal sandwich of thermally conductive component 102 and circuit boards is formed by attaching the circuit boards 104 and 106 their respective "component sides" 400 and 402, with respective electronic components 404 and 406, pointed away from the thermally conductive element 102. In this embodiment, the conductive element 102 may be relatively smooth, and thermal contact with the respective wiring sides 408 and 410 of the boards 104 and 106 may be enhanced by coating the sides of the conductive element 102 in contact with the circuit boards with a thermal grease. Additionally, for enhanced thermal transfer, an impression of the circuit traces from the wiring sides 408 and 410 may be formed in the respective sides of the conductive element 102, thus facilitating greater contact and greater thermal transfer between the boards 104 and 106 and the conductive element 102.

Figure 4B:
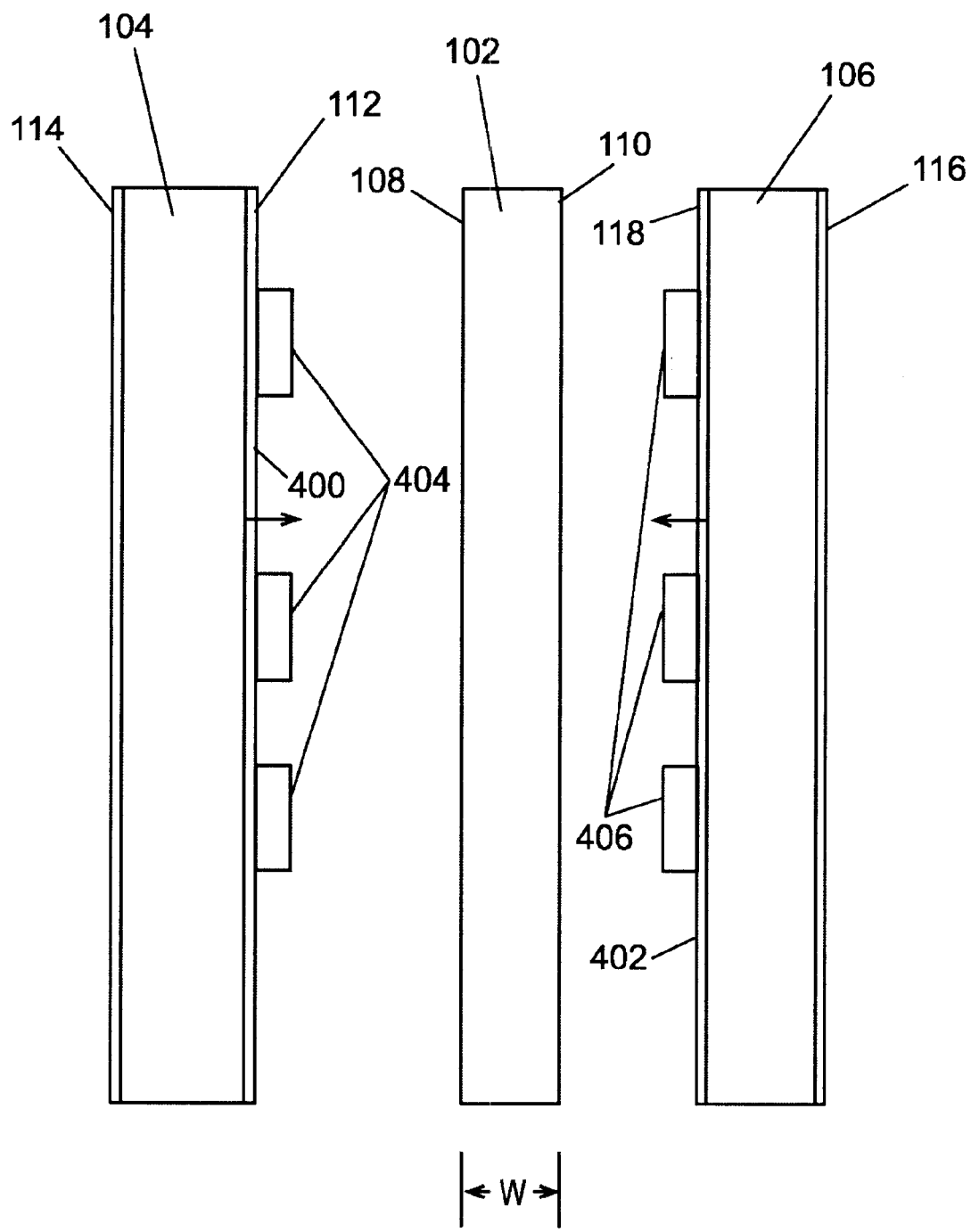

The front elevation view of FIG. 4B illustrates an embodiment of the invention in which the thermal sandwich of thermally conductive component 102 and circuit boards is formed by attaching the circuit boards 104 and 106 with their respective "component sides" 400 and 402 pointed inward toward the thermally conductive element 102. In this embodiment, the conductive element 102 may include one or more wells, or depressions, to conform to the profile of the component sides 400 and 402 of the boards 104 and 106. By conforming to the profiles of the component sides 400 and 402, the thermally conductive element 102 may make contact with a substantial portion of the total exposed area of the component sides 400 and 402 of the boards 104 and 106. Additionally, by making direct contact with the top surfaces of heat generating components 404 and 406, the thermally conductive element 102 may provide a more direct and efficient path for thermal dissipation within a card rack. As will be apparent to those of skill in the art, an embodiment with only one of the circuit boards component sides facing the thermally conductive component 102 is also possible.

Figure 5:
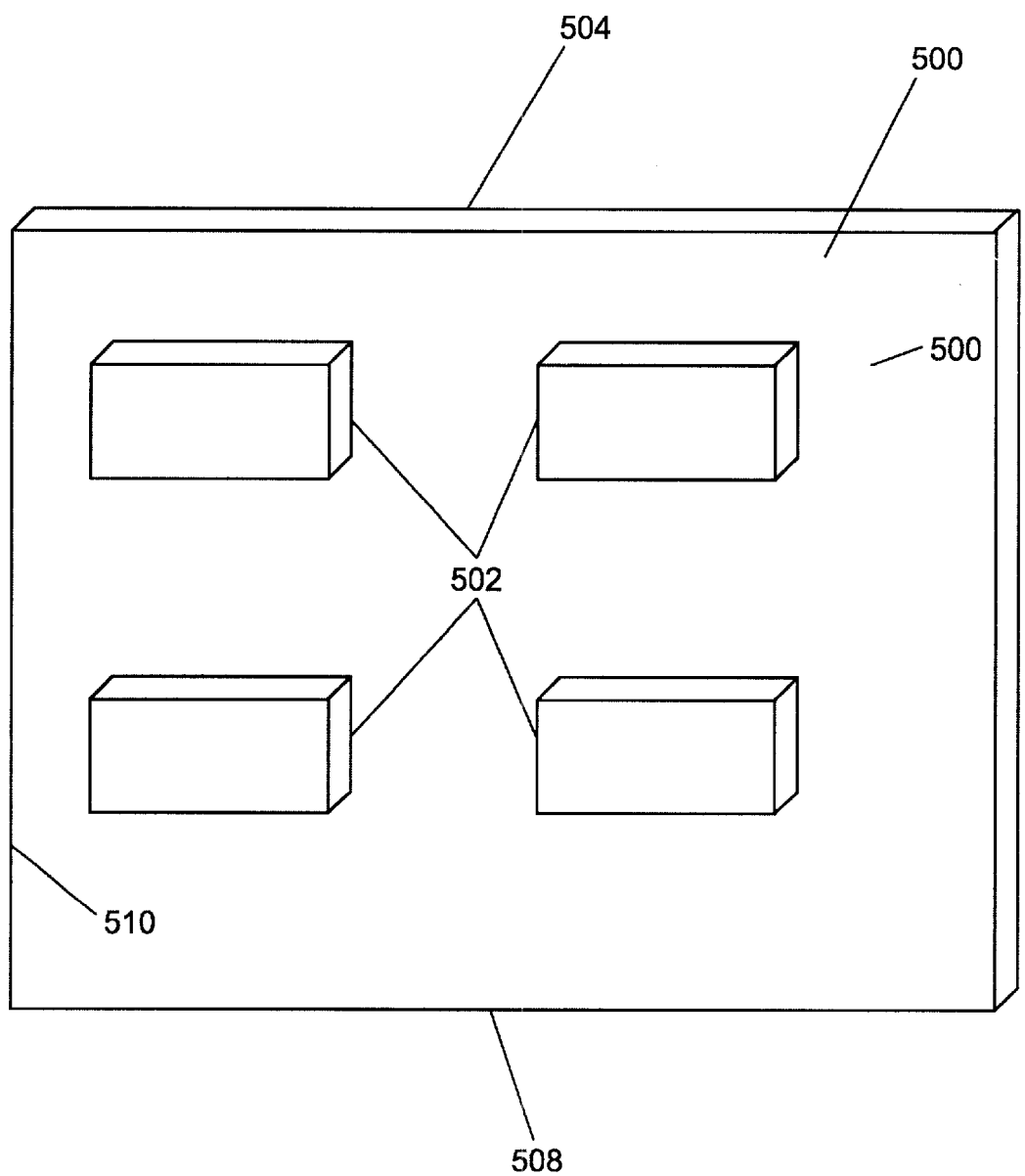
FIG. 5 is a side elevation view of a thermally by conductive element in accordance with the principles of the present invention in which wells have been formed to conform to the contours of the component side of a circuit board attached to the thermally conductive element.

The perspective view of FIG. 5 illustrates a thermally conductive element 500 in accordance with the principles of the present invention. In this illustrative embodiment, the thermally conductive element 500 includes depression 502 for admission of circuit components on the component side of a circuit board which attaches to the thermally conductive element 500. The depressions 502 may be enough to accommodate a component without forming apertures in the thermally conductive element 500. Alternatively, one or more of the depressions 502 may be deep enough to form an aperture in the thermally conductive element 500. After accepting thermal energy from a circuit board, the thermally conductive element 500 may transfer such energy through any surface, including edge surfaces 504, 506, 508, or 510, in addition to other surface areas that may not be covered by the circuit boards 104 and 106. Such thermal transfer may be a direct, conductive transfer through contact with a card cage, for example, or it may be a convective, or radiant transfer accelerated through known means, such as fans or heat exchangers.

Figure 6:
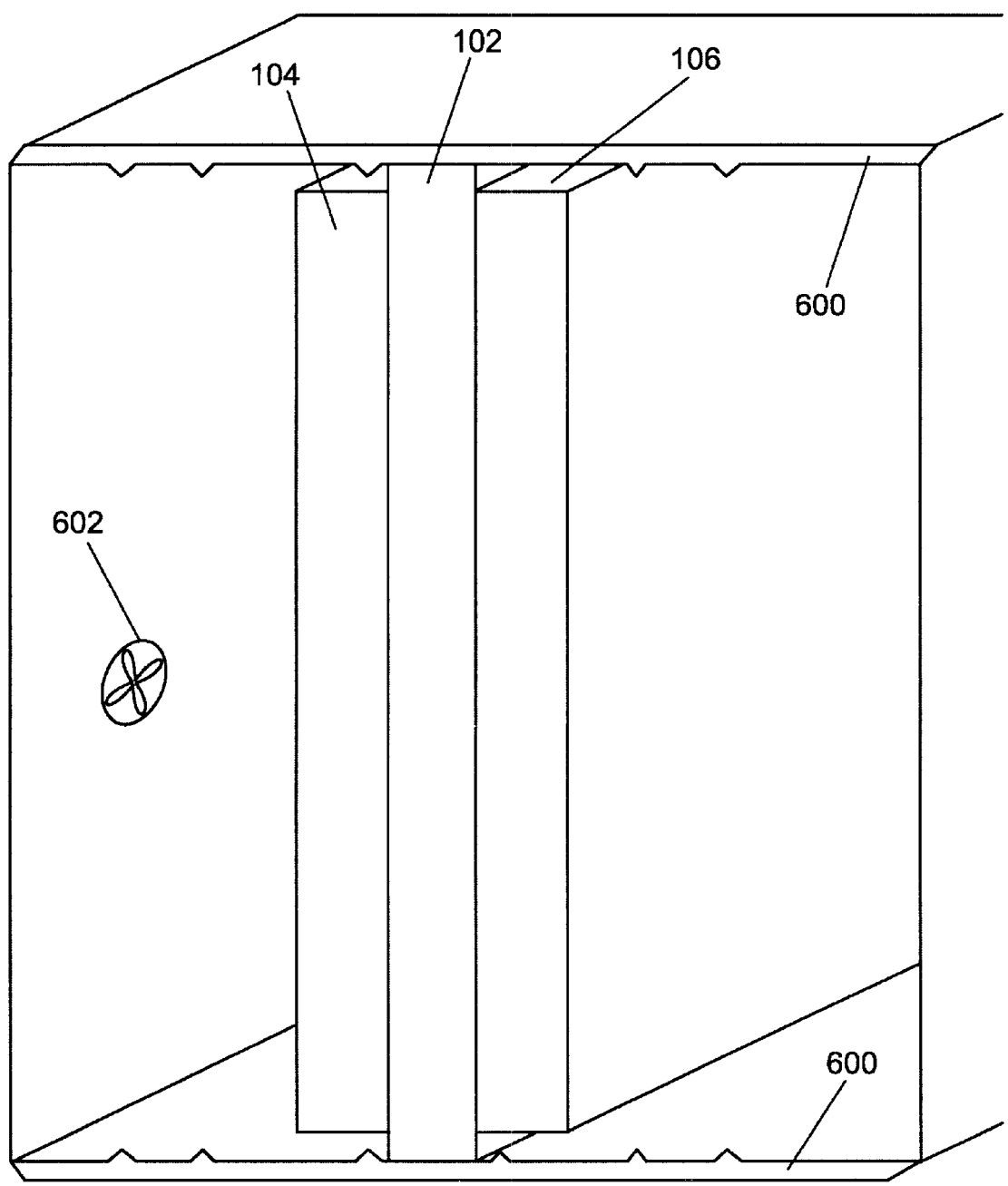
FIG. 6 is a perspective view of an electronic card cage which houses a circuit board cooling system in accordance with the principles of the present invention.
Figure 1:
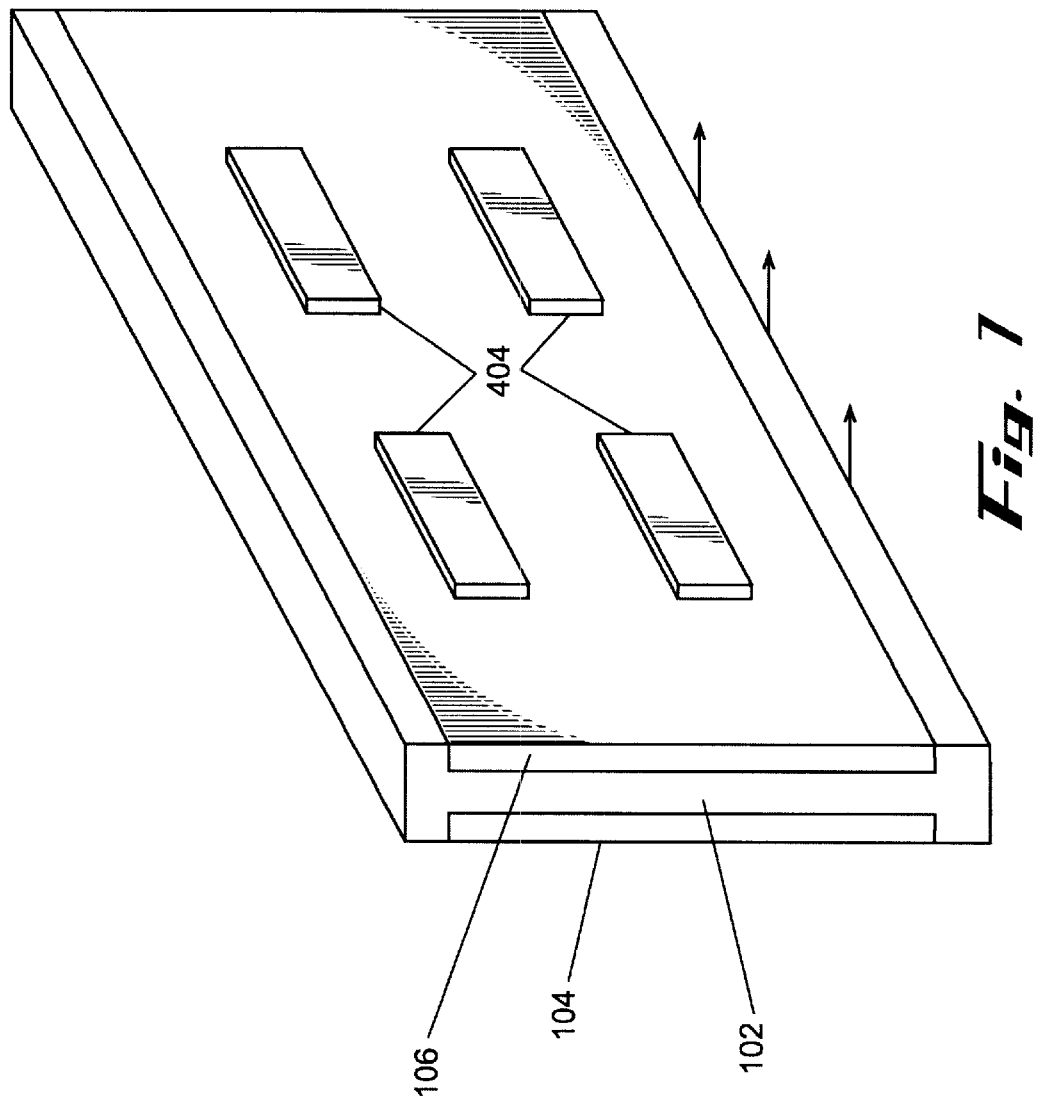

Turning now to FIG. 6 a card cage 600 includes a circuit board cooling system 100 in accordance with the principles of the present invention. As previously described, the circuit board cooling system includes circuit boards 104 and 104 and 106 attached to a thermally conductive element 102. In this illustrative embodiment, the thermally conductive element 102 extends vertically (and/or horizotally) beyond the perimeter of circuit boards 104 and 106 and acts as a card guide to guide the circuit boards to connections (not shown) at the rear of the card cage 600. The thermally conductive element 102 may make direct contact with the card cage 600 in order to conduct thermal energy from the attached circuit boards 104 and 106 to the card cage. In this illustrative embodiment, the card cage is made of a thermally conductive material, and thermal energy gathered by the thermally conductive element 103 from the circuit boards 104 and 106 is distributed from the thermally conductive element 102 to the card cage 600. A fan 602 may be used to accelerate the dissipation of thermal energy generated by the circuit boards 104 and 106.

In another aspect of the invention, a thermally conductive element 102 may, in addition to extending beyond the circuit boards 104 and 106, may be formed in the shape of a capital "I" as indicated in the perspective view of FIG. 7. By further enveloping the circuit boards 104 and 106 in this manner, the thermally conductive element 102 provides for greater heat transfer away from the circuit boards 104 and 106.

The perspective view of FIG. 8 illustrates another embodiment of the present invention in which a heat exchanger 800 provides for additional transfer of thermal energy from the attached circuit boards. A fluid mover 802, such as a fan, may be employed to accelerate the exchange of heat between the thermally conductive element 102 and the surrounding environment, thus permitting greater transfer of thermal energy away from the circuit boards 104 and 106. Additionally, a thermoelectric cooler 804 may be employed to further cool electronic components 404 carried on the circuit boards 104 and 106.

The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. A circuit board cooling system comprising:
   a substantially planar thermally conductive element having first and second planar sides, the first planar side having a first plurality of depressions and the second planar side having a second plurality of depressions;
   a first circuit card including a first plurality of components mounted thereon, the first circuit card attached to the first planar side of the thermally conductive element such that the first plurality of components are housed within the first plurality of depressions; and
   a second circuit card including a second plurality of components mounted thereon, the second circuit card attached to the second planar side of the thermally conductive element such that the second plurality of components are housed within the second plurality of depressions.

2. The circuit board cooling system of claim 1 wherein the thermally conductive element is a solid of high thermal conductivity material.

3. The circuit board cooling system of claim 2 wherein the material is copper.

4. The circuit board cooling system of claim 3 wherein the material is a copper alloy.

5. The circuit board cooling system of claim 1 wherein the thermally conductive element is a heat pipe.

6. The circuit board cooling system of claim 1 wherein the thermally conductive element further comprises a heat exchanger that extends beyond the perimeter of the attached circuit boards.

7. The circuit board cooling system of claim 6 further comprising a fluid mover configured to circulate a fluid over the heat exchanger.

8. A circuit board cooling system comprising:
   a thermally conductive card cage for receiving circuit boards, the card cage comprising at least one wall having an elevated contact area, a first cart slot located on a first side of the elevated contact area, and a second card slot located on a second side of the elevated contact area; and,
   a circuit board pack inside the card cage and in thermally conductive communication with the card cage, the circuit board pack including:
      a substantially planar thermally conductive element having an edge and first and second planar sides;
      a first circuit card attached to the first planar side of the thermally conductive element, the first circuit card extending beyond the conductive element; and
      a second circuit card attached to the second planar side of the thermally conductive element, the second circuit card extending beyond the conductive element;
   wherein the edge of the thermally conductive element is in thermal contact with the elevated contact area and the first and second circuit cards are housed in the first and second card slots.

9. The circuit board cooling system of claim 8 wherein the thermally conductive element is a solid of high thermal conductivity material.

10. The circuit board cooling system of claim 9 wherein the material is copper.

11. The circuit board cooling system of claim 10 wherein the material is a copper alloy.

12. The circuit board cooling system of claim 8 wherein the thermally conductive element is a heat pipe.

13. The circuit board cooling system of claim 8 further comprising a fluid mover configured to circulate air within the card cage.

14. The circuit board cooling system of claim 13 wherein the fluid mover is a fan.

15. The circuit board cooling system of claim 8 wherein the thermally conductive element further comprises a heat exchanger that extends beyond the perimeter of the attached circuit boards.

16. The circuit board cooling system of claim 15 further comprising a fluid mover configured to circulate a fluid over the heat exchanger.

17. The system of claim 1 further comprising a coating of dielectric material located on the thermally conductive element.

18. The system of claim 1 further comprising a layer of thermal grease on at least one of the first and second opposing sides of the conductive element.

19. The system of claim 10 further comprising a coating of thermal grease on the elevated contact portions.

20. The system of claim 8 further comprising a layer of thermal grease on the thermally conductive element.

21. A circuit board cooling system comprising:
   a circuit board pack comprising,
      a substantially planar thermally conductive element having an edge and first and second planar sides, the first planar side having a first plurality of depressions and the second planar side having a second plurality of depressions;
      a first circuit card including a first plurality of components mounted thereon, the first circuit card attached to the first planar side of the thermally conductive element such that the first plurality of components are housed within the first plurality of depressions, the first circuit card extending beyond the thermally conductive element;

a second circuit card including a second plurality of components mounted thereon, the second circuit card attached to the second planar side of the thermally conductive element such that the second plurality of components are housed within the second plurality of depressions, the second circuit card extending beyond the thermally conductive element; and a thermally conductive card cage for receiving the first and second circuit boards, the card cage comprising, at least one wall having an elevated contact area, a first card slot located on a first side of the elevated area and a second card slot located on a second side of the elevated area wherein the edge of the thermally conductive element is in thermal contact with the elevated contact area and the first and second circuit cards are housed in the first and second card slots.

\* \* \* \* \*